(12) United States Patent
Jones et al.

(10) Patent No.: US 6,765,509 B2
(45) Date of Patent: Jul. 20, 2004

(54) DATA COMPRESSION HAVING IMPROVED COMPRESSION SPEED

(75) Inventors: Simon Richard Jones, Loughborough (GB); Jose Luis Nunez Yanez, Loughborough (GB)

(73) Assignee: BTG International Limited, London (GB)

( * ) Notice: Subject to any disclaimer, the term of this patent is extended or adjusted under 35 U.S.C. 154(b) by 0 days.

(21) Appl. No.: 10/182,184

(22) PCT Filed: Jan. 22, 2001

(86) PCT No.: PCT/GB01/00237
§ 371 (c)(1),
(2), (4) Date: Oct. 4, 2002

(87) PCT Pub. No.: WO01/56169

PCT Pub. Date: Aug. 2, 2001

(65) Prior Publication Data

US 2003/0117299 A1 Jun. 26, 2003

(30) Foreign Application Priority Data

Jan. 25, 2000 (GB) .............................. 0001711

(51) Int. Cl.[7] ................................................ H03M 7/30
(52) U.S. Cl. ........................................ 341/51; 341/87
(58) Field of Search ..................... 341/51, 87

(56) References Cited

U.S. PATENT DOCUMENTS 4,876,541 A  10/1989  Storer 5,861,827 A  1/1999  Welch et al.

FOREIGN PATENT DOCUMENTS

JP  090232967  9/1997
WO  WO 98/04045  1/1998

OTHER PUBLICATIONS

Nunez et al., The X–MatchLITE FPGA–based data compressor, Proceedings of the 25TH Euromicro Conference, Sep. 1999, pp. 126–132.*

Nunez et al.; "The X–MatchLITE FPGA–Based Data Compressor"; *Proceedings of Euromicro–25*, (1999), pp. 126–132, XP000920739.

* cited by examiner

*Primary Examiner*—Howard L. Williams
(74) *Attorney, Agent, or Firm*—Nixon & Vanderhye (57) ABSTRACT

A lossless data compression system comprising a dictionary (30) based on content addressable memory and a coder (40) having between them a critical path including a feedback loop forming a dictionary adaption path, in which a circuit (42) is connected in the feedback loop so that the dictionary can be updated using data from a previous comparison cycle at the same time as the coder codes a current comparison cycle. The circuit (42) has a current adaptation vector (58, 62, 66) and a next adaption vector (60, 64, 68); at each search step the current adaptation vector updates data in the dictionary and also rearranges the next adaptation vector. Compression speed is increased.

17 Claims, 7 Drawing Sheets

Fig.1.

PRIOR ART

Fig.3 (Cont iii).

DATA COMPRESSION HAVING IMPROVED COMPRESSION SPEED

This invention relates to a method and apparatus for the lossless compression of data.

BACKGROUND OF THE INVENTION

While lossy data compression hardware has been available for image and signal processing for some years, lossless data compression has only recently become of interest, as a result of increased commercial pressure on bandwidth and cost per bit in data storage and data transmission; also, reduction in power consumption by reducing data volume is now of importance.

The principles of searching a dictionary and encoding data by reference to a dictionary address is well known, and the apparatus to apply the principle consists of a dictionary and a coder/decoder.

In Proceedings of EUROMICRO-22, 1996, IEEE, "Design and Performance of a Main Memory Hardware Data Compressor", Kjelso, Gooch and Jones describe a novel compression method, termed the X-Match algorithm, which is efficient at compressing small blocks of data and suitable for high speed hardware implementation.

The X-Match algorithm maintains a dictionary of data previously seen, and attempts to match a current data element, referred to as a tuple, with an entry in the dictionary, replacing a matched tuple with a shorter code referencing the match location. The algorithm operates on partial matching, such as 2 bytes in a 4 byte data element. In Proceedings of EUROMICRO-25, 1999, IEEE, "The X-MatchLITE FPGA-Based Data Compressor", Nunez, Feregrino, Bateman and Jones describe the X-Match algorithm implemented in a Field Programmable Gate Array (FPGA) prototype.

SUMMARY OF THE INVENTION

It is an object of the invention to provide a lossless data compression algorithm which can compress data at a faster rate than is possible with the published arrangement.

According to the invention a lossless data compression system comprising a dictionary based on content addressable memory and a coder having between them a feedback loop forming a dictionary adaptation path, characterised by register means connected in the feedback loop whereby the dictionary can be updated using data from a previous comparison cycle at the same time as the coder codes a current comparison cycle.

Also according to the invention, a lossless method of compressing data comprising the steps of:

comparing a search tuple of fixed length with a plurality of tuples of said fixed length stored in a dictionary;
indicating the location in the dictionary of a full or partial match or matches;
selecting a best match of any plurality of matches; and
encoding the match location and the match type;
characterised by the further steps of:
  providing the dictionary with a current adaptation vector and a next adaptation vector;
  and after comparison of each search tuple
    (a) updating the contents of the dictionary in accordance with the current adaptation vector and
    (b) updating the next adaptation vector in accordance with the current adaptation vector.

BRIEF DESCRIPTION OF THE DRAWINGS

In the drawings.

The invention will be described by way of example only with reference to FIGS. 2–5 in which.

DETAILED DESCRIPTION OF PREFERRED EMBODIMENTS

Figure 1:
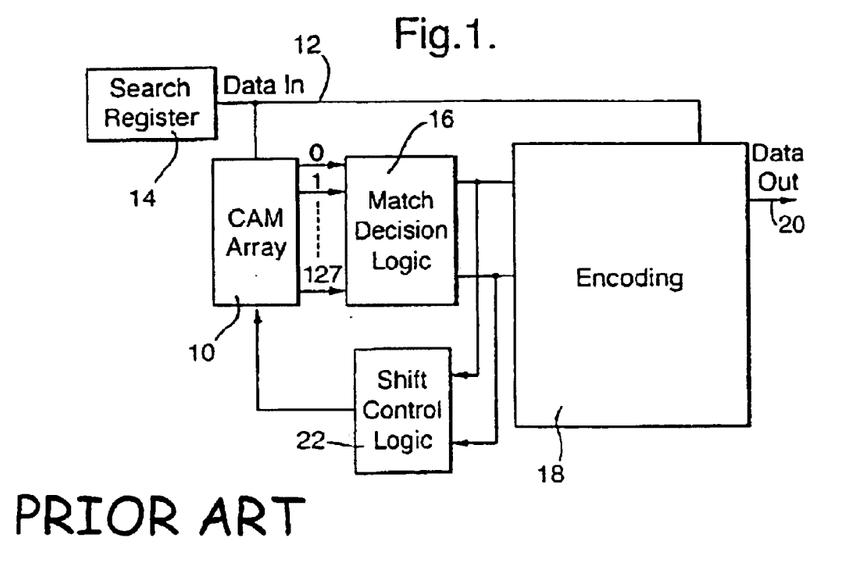
FIG. 1 illustrates the architecture of a compressor arrangement published by Nunez et al.

In the prior art as shown in FIG. 1, a dictionary 10 is based on Content Addressable Memory (CAM) and is searched by data 12 supplied by a search register 14. In the dictionary 10 each data element is exactly 4 bytes in width and is referred to as a tuple. With data elements of standard width, there is a guaranteed input data rate during compression and output data rate during decompression, regardless of data mix.

The dictionary stores previously seen data for a current compression; when the search register 14 supplies a new entry and a match is found in the dictionary, the data is replaced by a shorter code referencing the match location. CAM is a form of associative memory which takes in a data element and gives a match address of the element as its output. The use of CAM technology allows rapid searching of the dictionary 12, because the search is implemented simultaneously at every address at which data is stored, and therefore simultaneously for every stored word.

In the X-Match algorithm, perfect matching is not essential. A partial match, which may be a match or 2 or 3 of the 4 bytes, is also replaced by the code referencing the match location and a match type code, with the unmatched byte or bytes being transmitted literally, everything prefixed by a single bit. This use of partial matching improves the compression ratio when compared with the requirement of 4 byte matching, but still maintains high throughput of the dictionary.

The match type indicates which bytes of the incoming tuple were found in the dictionary and which bytes have to be concatenated in literal form to the compressed code. There are 11 different match types that correspond to the different combinations of 2,3 or 4 bytes being matched. For example 0000 indicates that all the bytes were matched (full match) while 1000 indicates a partial match where bytes 0,1 and 2 were matched but byte 3 was not and in this example byte 3 must be added as an uncompressed literal to the code. Since some match types are more frequent than others a static Huffman code based on the statistics obtained through extensive simulation is used to code them. For example the most popular match type is 0000 (full match) and the corresponding Huffman code is 01. On the other hand a partial match type 0010 (bytes 3, 2 and 0 match) is more infrequent so the corresponding Huffman code is 10110. This technique improves compression.

If, for example, the search tuple is CAT, and the dictionary contains the word SAT at position 2, the partial match will be indicated in the format (match/miss) (location) (match type) (literals required) which in this example would be 022S, binary code 0 000010 0010 1010011, i.e. the capital C is not matched and is sent literally to the coding part of the system.

The algorithm, in pseudo code, is given as:

```
Set the dictionary to its initial state;
DO
    { read in tuple T from the data stream;
    search the dictionary for tuple T;
    IF (full or partial hit)
        { determine the best match location
        ML and the match type MT;
        output '0';
        output Binary code for ML;
        output Huffman code for MT;
        output any required literal
        characters of T; }
    ELSE
        { output '1';
        output tuple T; }
    IF (full hit)
        {move dictionary entries 0 to ML-1 by
        one location;}
    ELSE
        { move all dictionary entries down by
        one location;}
    copy tuple T to dictionary location 0; }
WHILE (more data is to be compressed);.
```

The dictionary 10 is arranged on a Move-To-Front strategy, i.e. a current tuple is placed at the front of the dictionary and other tuples moved down by one location to make space. If the dictionary becomes full, a Least Recently Used (LRU) policy applies, i.e., the tuple occupying the last location is simply discarded.

The dictionary is preloaded with common data.

The coding function for a match is required to code three separate fields, i.e.

(a) the match location in the dictionary 10; uniform binary code where the codes are of the fixed length log 2 (DICTIONARY_SIZE) is used.

(b) a match type; i.e. which bytes of an incoming tuple match in a dictionary location; a static Huffman code is used.

(c) any extra characters which did not match the dictionary entry, transmitted in literal form.

Referring again to FIG. 1, the match, or partial match or several partial matches, are output by the dictionary 10 to a match decision logic circuit 16, which supplies encoding equipment 18 which provides a compressed data output signal 20. Shift control logic 22 connected between the match decision logic 16 and the dictionary 12 provides shift signals to the dictionary. The whole circuit can be provided on a single semiconductor chip.

The critical path incorporating a feedback loop which forms the dictionary adaptation patch includes the search register 14, the match decision logic 16, the shift control logic 22 and the CAM array 10.

Figure 2:
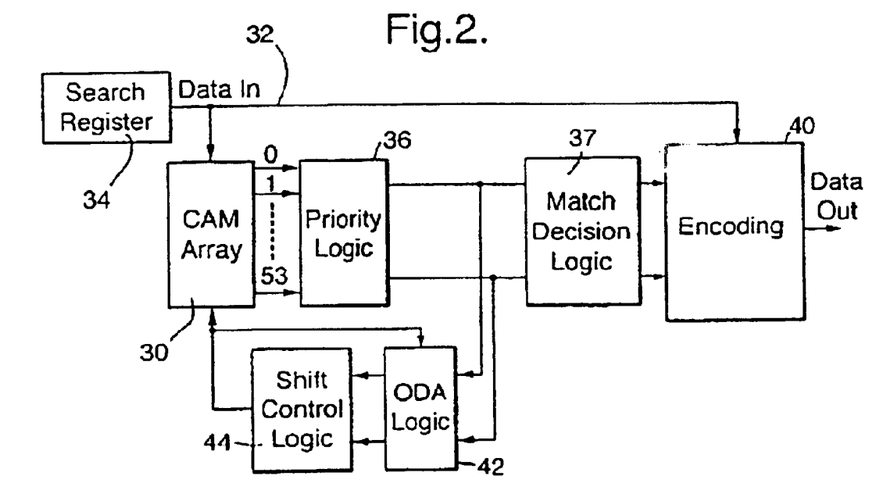
FIG. 2 illustrates the architecture of the compressor hardware

Referring now to a compressor according to the invention as illustrated in FIG. 2, a dictionary 30 is based on CAM technology and is supplied with data to be searched 32 by a search register 34. The dictionary searches in accordance with the X-Match algorithm, and is organised on a Move To Front strategy and Least Recently Used policy.

The dictionary output is connected to a priority logic 36 which is connected through a match decision logic 37 to an encoding circuit 40, which provides an output stream of compressed data 41.

The match decision logic circuit 37 also provides signals to a circuit 42 which will be referred to as an Out-of-Date Adaptation (ODA) register; the ODA circuit 42 supplies a shift control logic circuit 44 which supplies "move" signals to the dictionary 30.

The arrangement is such that the dictionary 30 is updated on an out-of-date basis, a next adaptation vector t to be applied to the dictionary is transformed into a current adaptation vector t+1 and at the same time the dictionary is updated; the transformation and updating, are performed by the current adaptation vector after each search step.

Figure 3:
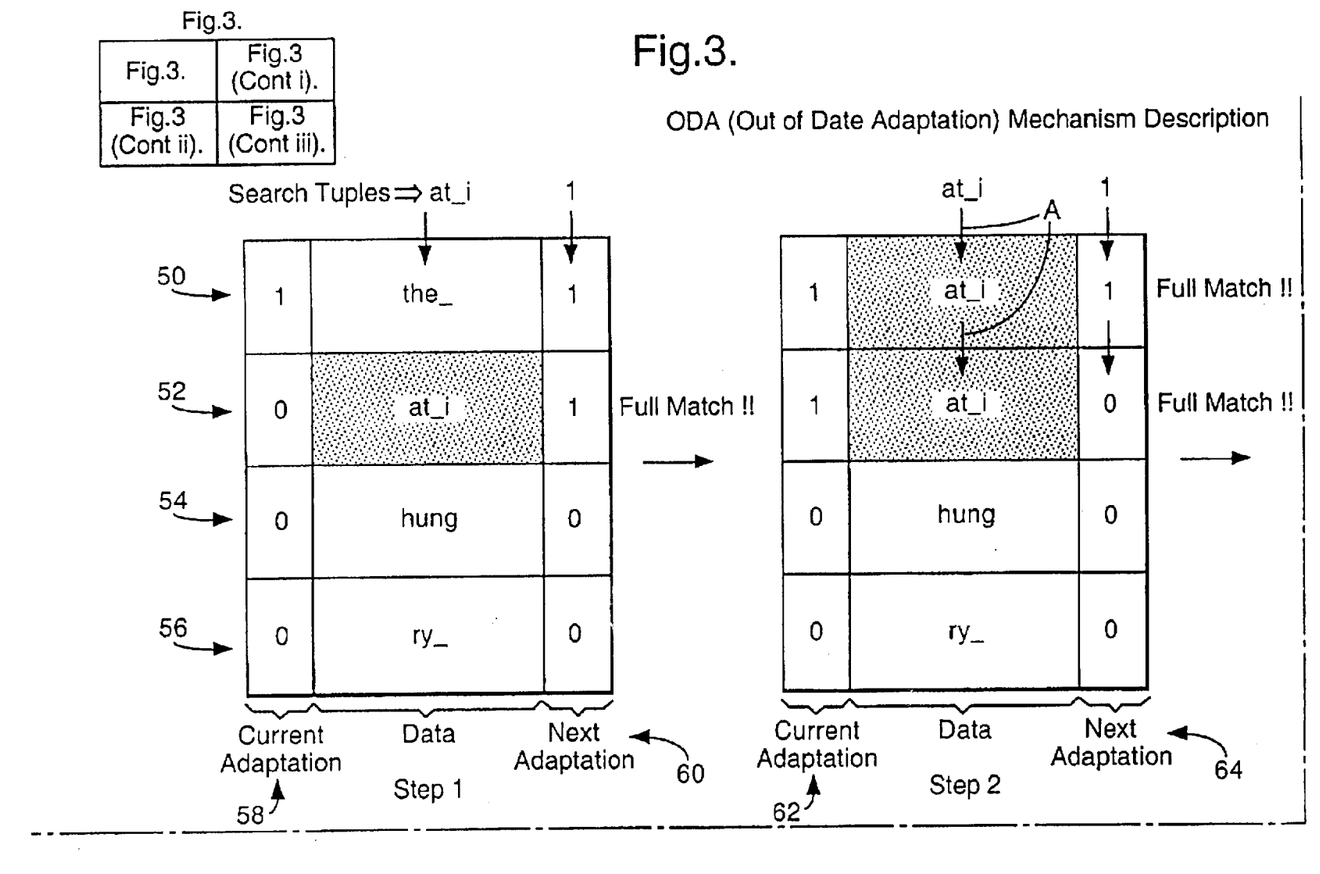
FIG. 3 illustrates the inventive adaptation of the dictionary

FIG. 3 illustrates the ODA adaptation applied to the dictionary data and to the adaptation vectors. Eight steps are shown; for each step the top/front four dictionary addresses 0, 1, 2, 3, references 50, 52, 54, 56, are shown, with a current adaptation vector 58 shown on the left of the addresses and a next adaptation vector 60 shown on the right. In the adaptation vectors 58, 60, a bit set to 1 means "load data from previous position" and a bit set to 0 means "keep current data".

In each of the eight steps, a search tuple is loaded into address 0, reference 50, and the previously stored data in that address is deleted; this is indicated by the current adaptation vector on the left hand side of location 0 being set to 1 in all eight steps.

The arrows pointing downwards within the dictionary, such as the arrows A, indicate rearrangement of the dictionary at the end of each step under the control of the current adaptation vector of that step.

In step 1, the top dictionary address 50 at position 0 contains "the_", the second position at address 52 contains "at_i"; the third address 52, position 2, contains "hung" and the fourth address, 56, position 3 contains "ry_". It will be seen that each location content is exactly 4 bytes long.

The search tuples for each step are shown above the data; in step 1 the search tuple is "at_i". A full match is found at position 1, shown shaded, and this information is output as a code indicating position 1. In the next adaptation vector 60, the bits at positions 0 and 1, addresses 50, 52, are set to 1, indicating that a match was found at position 1. The current adaptation vector 58 rearranges the dictionary, i.e. rearranges the data in positions 0, 1, 2 and 3 in accordance with the vector values; at position 0, the bit value is 1 indicating "load data" and the search tuple is loaded at position 0 as stated above. The other three bits are set to 0, so no change is made to the data in positions 1, 2 or 3, as can be seen in step 2. The current adaptation vector 58 also rearranges the next adaptation vector 60 in accordance with its bit values; the next adaptation vector 60 becomes the current adaptation vector 62 in step 2. The bits of the current adaptation to 58 at positions 1, 2 and 3 are all set to zero, meaning "keep current data", so the next adaptation vector 60 is unchanged as it is transferred to become the current adaptation vector 62 in step 2.

In step 2, the search tuple is "at_i"; a full match is detected at positions 0 and 1 in addresses 50 and 52 and both are shown shaded. The algorithm is arranged to select the address of a match (or partial match) closer to the top/front of the dictionary, so the match at position 0 is taken as a valid match and is output; the next adaptation vector 64 is set to 1 position 0, and to 0 at all positions below position 1 i.e. below the position at which the match was found. The current adaptation vector 62 rearranges the dictionary 30, loads the search tuple in position 0, and updates the next adaptation vector 64.

In step 3, the search tuple is "ry_", and a full match is found at position 3, shown shaded, the output signal indicating this position. The current adaptation vector 66 updates the dictionary and transforms the next adaptation vector 68, so that the bits in all vector positions above that at which a match is found are set to 1.

In step 4 it can be seen that the duplicate entry "at_i" has been eliminated. The search tuple is "hung" and a full match is found at position 2. The dictionary is rearranged by the current adaptation vector; but the bit value at all positions is 1, so all dictionary entries move down one place. The next adaptation vector is also updated.

In step 5 the search tuple is again "hung" and full matches are found at positions 0 and 3; the match at position 0 is selected by the algorithm and the adaptation vector is set to 1 at that position with the bits at all other positions being set to 0. The duplicate entry of "hung" is eliminated.

In step 6 the search tuple is "over" and there are no matches; the miss sets all bits in the next adaptation vector to 1. There are two addresses containing the entry "hung", but only two; in the arrangement according to the invention there can never be three or more addresses with the same entry, which prevents dictionary efficiency degradation.

In step 7, the duplicate entry of "hung" has been eliminated. The search tuple is again "over" and a match is found in position 0; this new word is added to the dictionary, the current adaptation vector reorganises the dictionary and updates the next adaptation vector.

In step 8, the search tuple is "_ung" and a partial match is found in position 2. As explained with reference to the prior art, partial matches are valid in arrangements using the previously known version of the X-Match algorithm. While the position of the partial match is output for encoding, as far as the adaptation vectors are concerned, a partial match is treated as a miss.

It will be clear that data within the dictionary is not duplicated in storage, all dictionary elements are unique at all times except the dictionary element at the top of the dictionary that can be duplicated. Dictionary data duplication is restricted to location 0. This is because the adaptation at time t is performed with an adaptation vector generated at cycle t–2 and modified according to invention.

It will apparent that the dictionary 30 has, in effect, lost one address because data duplication can take place between position 0 in the dictionary and any other position greater than 0 and less than the dictionary size. However, this arrangement allows duplicate entries to be eliminated quickly and efficiently.

The provision of an ODA circuit 42 in effect breaks a speed-limiting feedback loop in the system, removing it from the list of critical paths in the chip. Thus the speed of compression can be improved with very little deleterious effect on the compression efficiency.

Figure 4:
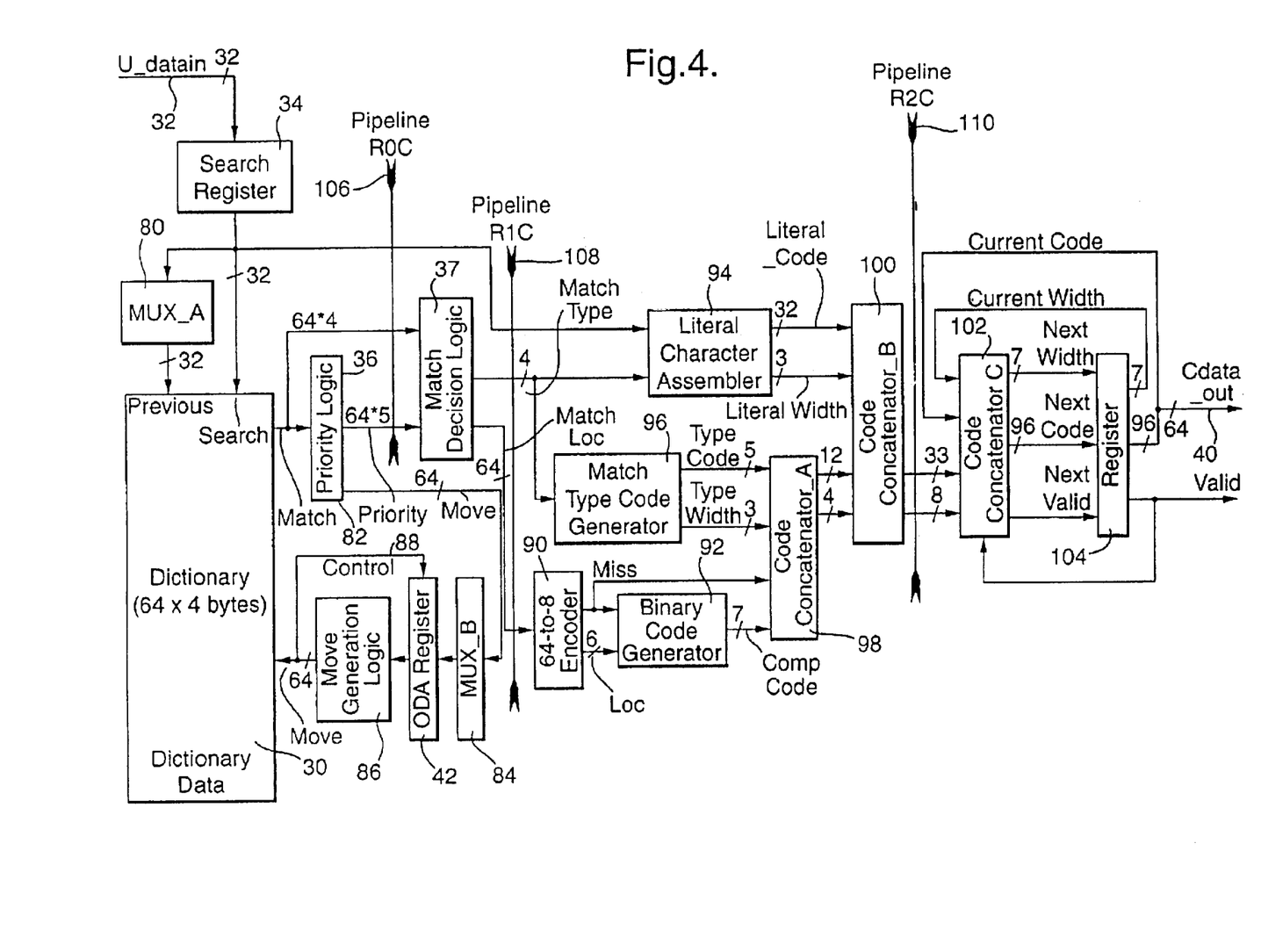
FIG. 4 shows the detailed arrangement of the compressor hardware.

FIG. 4 shows the full circuit of a compressor according to the invention based on the FIG. 2 architecture. As is conventional, the number of bits on a connection is indicated adjacent to a bar crossing that connection.

The dictionary 30 is a 64 element CAM-based array, supplied with input data through a 32 bit wide search register 34. Data for search are provided directly to the dictionary 30 while a multiplexer 80 is arranged to select the search register during compression, and has an additional function during decompression (see FIG. 5).

The output of the dictionary 30 i.e. an indication of the dictionary address at which a match has been found, or the address of a partial match plus the unmatched bit, passes to a priority logic circuit 82, which transforms the 4 bit wide match to a 5 bit wide priority type for each location in the dictionary and supplies the priority type to the match decision logic circuit 37; circuit 37 also receives the output of the dictionary 30 directly. The circuit 37 uses the priority types to select the best match location for the compression process.

The ODA circuit 42 receives a signal from the priority logic circuit 36 through multiplexer 84; the multiplexer 84 is a 64 bit wide multiplexer arranged to select the active move vector depending on whether compression or decompression is active. The ODA circuit 42 is a 64 bit wide register and asssociated multiplexor circuitry which creates the out of date adaptation mechanism as illustrated in FIG. 3.

The output of the ODA circuit 42, which is 64 bits wide, is supplied to a move generation logic circuit 86, equivalent to the shift control logic 44 in FIG. 2, which propagates a 64 bit wide match vector to generate the move vector to adapt the dictionary 30. The same vector, i.e. the current adaptation vector, such as 58, 62 or 66 in FIG. 3, is fed back by the control path 88 of the ODA circuit 42 to adapt the next adaptation vector, such as the vector 60, 68 in FIG. 3.

Turning now to the remainder of the apparatus illustrated in FIG. 4, which functions in a manner similar to that described in the prior art referred to above, the match decision logic circuit 37 supplies the match location to a 64-to-6 encoder 90 which transforms the uncoded 64 bit wide match location into a 6 bit wide coded match location. The output of the encoder 90 passes to a binary code generator 92 which concatenates the miss or match bit to the match location.

The match decision logic circuit 37 also supplies a match type signal to a literal character assembler 94, which constructs the literal part of a compressed code for non-matched bytes, and to a match type code generator 96 which creates static Huffman code for the match types. The match types code and match type width signals from the match type code generator 96, and the compressed code from the binary code generator 92, pass to a first code concatenator 98 which assembles code for the match type and match location. A second code concatenator 100 receives output from concatenator 98 and also literal code and literal width signals from the literal character assembler 94 and provides output to code concatenator 102 which assembles the current compressed code with previous compressed code. Concatenator 10 outputs signals next width, next code, and next valid to a register 104, which is a 96 bit wide output register for the data and a 7 bit wide register for the length of valid data bits. The register 104 outputs compressed data 40, and also a valid signal, which is fed back to code concatenator 102 together with the current code and a current width signal from the register 104.

Pipelines R0C, R1C, R2C, respectively references 106, 108 and 110, indicate pipeline registers of the compression path.

Figure 5:
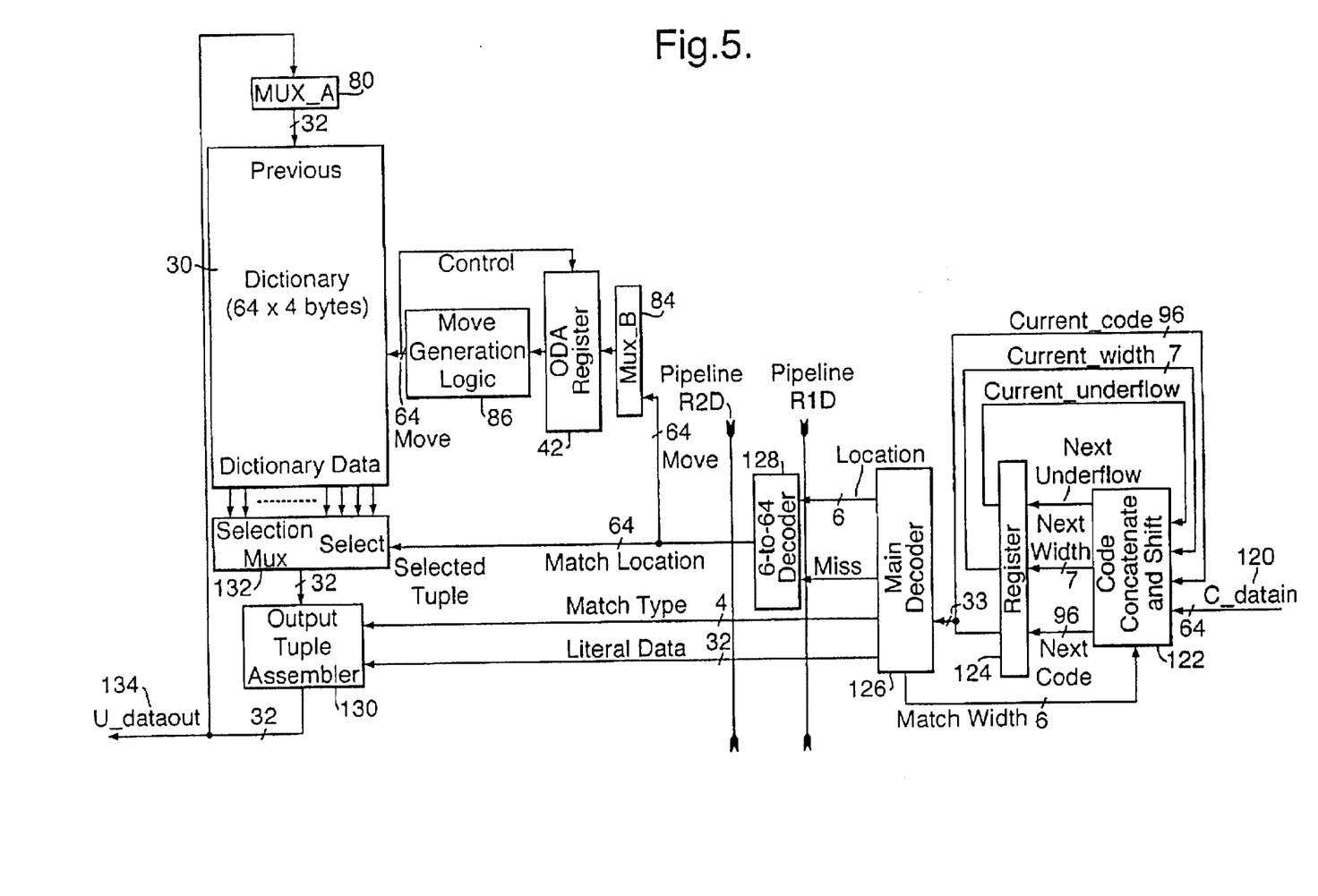
FIG. 5 illustrates the decompressor hardware.

FIG. 5 illustrates a decompression circuit. The dictionary 30, multiplexer 80, multiplexer 84 and ODA circuit 42 and move generation logic circuit 86 are connected as for the compression circuit.

Compressed data in, reference 120, is supplied to a code concatenate and shift circuit 122 which assembles new compressed data with old compressed data and shifts out data which has been decompressed. The signals next underflow, next width (7 bits) and next code (96 bits) pass to a register 124 for temporary storage of compressed data. The register output is supplied to a main decoder 126, which decodes compressed code of a maximum 33 bits into 6 bit location address, 4 bit match type, and 32 bit literal data. Both the 6 bit location address and miss signals pass to a 6 to 64 decoder 128 which decodes a 6 bit coded dictionary address into its uncoded 64 bit equivalent.

The match type and literal data signals pass from the main decoder 126 to an output tuple assembler 130.

The 6 to 64 decoder 128 passes match location signals to the multiplexer 84. The ODA circuit 42, the move generation logic circuit 86 and the dictionary 30 operate to decompress the compressed data, working in the reverse to the compression process. The multiplexer 80 selects a newly formed tuple for application to the dictionary 30. The dictionary data is supplied to a selection multiplexer 132 which also receives a selected tuple signal from the 6-to-64 decoder 128. The selective multiplexer 132 selects one tuple out of the dictionary and supplies it to the output tuple assembler 130 which assembles the literal data and the dictionary word, depending on the type of match which has been decompressed.

The uncompressed data-out 134 is identical to the data-in 32. There has been no loss.

The present invention is likely to find application when small blocks of data are to be compressed.

What is claimed is:

1. A lossless data compression system comprising:
    a dictionary based on content addressable memory;
    a coder;
    a critical path between said dictionary and said coder including a feedback loop forming a dictionary adaptation path; and
    circuit means connected in the feedback loop whereby the dictionary can be updated using data from a previous comparison cycle at the same time as the coder codes a current comparison cycle.

2. A system according to claim 1 in which said previous adaptation cycle is the next but one previous cycle.

3. A system according to claim 1 in which the circuit means is arranged to update the dictionary in accordance with a preceding data element while a current data element is being processed by the dictionary.

4. A system according to claim 1 in which the circuit means is arranged to update the dictionary in accordance with a preceding data element while a current data element is being processed by the dictionary and in which said previous adaptation cycle is the next but one previous cycle.

5. A system according to claim 1 in which the circuit means has a current adaptation vector and a next adaptation vector and is arranged so that at each search step the current adaptation vector is arranged to update data in the dictionary and to rearrange the next adaptation vector.

6. A system according to claim 1 in which the circuit means has a current adaptation vector and a next adaptation vector and is arranged so that at each search step the current adaptation vector is arranged to update data in the dictionary and to rearrange the next adaptation vector and in which the circuit means is arranged to update the dictionary in accordance with a preceding data element while a current data element is being processed by the dictionary.

7. A system according to claim 1 in which the dictionary is arranged so that at each step a previous search tuple is loaded into the top/front address of the dictionary.

8. A system according to claim 1 in which the dictionary is arranged so that at each step a previous search tuple is loaded into the top/front address of the dictionary in which said previous adaptation cycle is the next but one previous cycle.

9. A system according to claim 1 in which the dictionary is arranged so that at each step a previous search tuple is loaded into the top/front address of the dictionary in which the circuit means is arranged to update the dictionary in accordance with a preceding data element while a current data element is being processed by the dictionary.

10. A system according to claim 1 in which the dictionary is arranged to hold data elements which are all of precisely equal length.

11. A system according to claim 1 in which the dictionary is arranged to indicate the address of a full match or a partial match to a search tuple.

12. A system according to claim 1 in which the dictionary is arranged to indicate the address of a full match or a partial match to a search tuple and in which said previous adaptation cycle is the next but one previous cycle.

13. A system according to claim 1 which the dictionary is arranged to indicate the address of a full match or a partial match to a search tuple and in which the circuit means is arranged to update the dictionary in accordance with a preceding data element while a current data element is being processed by the dictionary.

14. A system according to claim 1 which when the dictionary indicates a partial match, the unmatched bytes are sent literally to the code.

15. A lossless data decompression system comprising a content addressable memory dictionary and a decoder, having between them a feedback loop forming a dictionary adaptation path characterised by circuit means connected in the feedback loop, whereby the dictionary can be updated using data from a previous comparison cycle at the same time as the coder codes current comparison cycle.

16. A lossless method of compressing data comprising the steps of:
    comparing a search tuple of fixed length with a plurality of tuples of said fixed length stored in a dictionary;
    indicating the location in the dictionary of a full or partial match or matches;
    selecting a best match of any plurality of matches;
    coding the match location and the match type;
    providing the dictionary with a current adaptation vector and a next adaptation vector;
    and after comparison of each search tuple
        updating the contents of the dictionary in accordance with the current adaptation vector, and
        updating the next adaptation vector in according with the current adaptation vector.

17. A method according to claim 16, comprising performing the comparison of a search tuple in a first clock cycle, and storing said tuple in the front position in the dictionary in the next clock cycle.

* * * * *